(12) United States Patent
Matsumoto

(10) Patent No.: US 12,241,949 B2
(45) Date of Patent: Mar. 4, 2025

(54) QUANTUM INTERFERENCE DEVICE

(71) Applicant: NEC Corporation, Tokyo (JP)

(72) Inventor: Kenta Matsumoto, Tokyo (JP)

(73) Assignee: NEC CORPORATION, Tokyo (JP)

(*) Notice: Subject to any disclaimer, the term of this patent is extended or adjusted under 35 U.S.C. 154(b) by 198 days.

(21) Appl. No.: 18/113,202

(22) Filed: Feb. 23, 2023

(65) Prior Publication Data
US 2023/0273275 A1    Aug. 31, 2023

(30) Foreign Application Priority Data
Feb. 28, 2022    (JP) .................................. 2022-029511

(51) Int. Cl.
*G01R 33/035*    (2006.01)

(52) U.S. Cl.
CPC ................................ *G01R 33/0354* (2013.01)

(58) Field of Classification Search
CPC ............................ G01R 33/0354; G04F 5/145
USPC .................................................... 331/94.1
See application file for complete search history.

(56) References Cited

U.S. PATENT DOCUMENTS

2010/0201452 A1* 8/2010 Aoyama ................... G02F 2/02
331/3

FOREIGN PATENT DOCUMENTS

JP    2014-053841 A    3/2014

* cited by examiner

*Primary Examiner* — Richard Tan
(74) *Attorney, Agent, or Firm* — Sughrue Mion, PLLC

(57) ABSTRACT

A quantum interference device according to the present invention includes a light generating unit configured to generate an excitation light having at least two frequency components, an alkali metal atom cell to which the excitation lights are emitted, a light detecting unit configured to detect a transmitted light from the alkali metal atom cell, and a control unit configured to execute a frequency determination process to determine a resonance frequency in a quantum interference state to be a reference based on the transmitted light. Then, the control unit is configured to detect resonance frequencies in at least two quantum interference states from the transmitted light, and control the frequency determination process based on the detected resonance frequencies in the at least two quantum interference states and magnetic field information representing preset variation amounts of the resonance frequencies in the at least two quantum interference states with respect to a magnetic field.

17 Claims, 16 Drawing Sheets

QUANTUM INTERFERENCE DEVICE

INCORPORATION BY REFERENCE

This application is based upon and claims the benefit of priority from Japanese patent application No. 2022-029511, filed on Feb. 28, 2022, the disclosure of which is incorporated herein in its entirety by reference.

TECHNICAL FIELD

The present invention relates to a quantum interference device and a control method thereof.

BACKGROUND ART

An atomic oscillator that oscillates based on the energy transition of an alkali metal atom is known as an oscillator that has a long-term, highly accurate oscillation characteristic. In an atomic oscillator, when there is a variation in the magnetic field at the position of the atomic gas, the transition energy between atomic levels varies, resulting in a decrease in the stability of the oscillation frequency. For this reason, in general, the atomic oscillator is provided with a magnetic field correction device having a magnetic field shielding function or a magnetic field canceling function. It is common to provide the atomic oscillator with, as a device having a magnetic field shielding function, for example, a magnetic shield that covers the position of the atomic gas. A technique relating to a magnetic field correction device having a magnetic field canceling function is disclosed in, for example, Patent Document 1.

Patent Document 1: Japanese Unexamined Patent Application Publication No. JP-A 2014-053841

However, sufficient performance could not be obtained with the magnetic field correction device described in Patent Document 1. The reason is as follows.

First, Patent Document 1 discloses a technique for demagnetizing a magnetic field originating from an electric current generating part inside the device, but it is difficult to deal with an unintended magnetic field variation occurring at the position of the atomic gas due to the environment outside the device, and it is difficult to ensure high frequency stability.

Further, there is a case where a magnetic shield is installed for the purpose of suppressing an unintended magnetic field variation occurring at the position of the atomic gas due to the external magnetic field. However, in order to increase magnetic field shielding performance, it is required to install a bulky magnetic shield outside the atom container, which is a factor restricting the miniaturization of an atomic oscillator.

SUMMARY OF THE INVENTION

Accordingly, an object of the present invention is to provide a quantum interference device which can solve the abovementioned problem that it is difficult to ensure high frequency stability in response to a magnetic field variation while achieving the miniaturization thereof.

A quantum interference device according to an aspect of the present invention includes a light generating unit configured to generate an excitation light having at least two frequency components, an alkali metal atom cell to which the excitation lights are emitted, a light detecting unit configured to detect a transmitted light from the alkali metal atom cell, and a control unit configured to execute a frequency determination process to determine a resonance frequency in a quantum interference state to be a reference based on the transmitted light. The control unit is configured to detect resonance frequencies in at least two quantum interference states from the transmitted light, and control the frequency determination process based on the detected resonance frequencies in the at least two quantum interference states and magnetic field information representing preset variation amounts of the resonance frequencies in the at least two quantum interference states with respect to a magnetic field.

Further, a control method as an aspect of the present invention is a control method executed by a control unit in a quantum interference device including a light generating unit configured to generate an excitation light having at least two frequency components, an alkali metal atom cell to which the excitation lights are emitted, a light detecting unit configured to detect a transmitted light from the alkali metal atom cell and the control unit configured to execute a frequency determination process to determine a resonance frequency in a quantum interference state to be a reference based on the transmitted light. The control method includes, by the control unit, detecting resonance frequencies in at least two quantum interference states from the transmitted light, and controlling the frequency determination process based on the detected resonance frequencies in the at least two quantum interference states and magnetic field information representing preset variation amounts of the resonance frequencies in the at least two quantum interference states with respect to a magnetic field.

Further, a control device as an aspect of the present invention is a control device in a quantum interference device including a light generating unit configured to generate an excitation light having at least two frequency components, an alkali metal atom cell to which the excitation lights are emitted, a light detecting unit configured to detect a transmitted light from the alkali metal atom cell and the control device configured to execute a frequency determination process to determine a resonance frequency in a quantum interference state to be a reference based on the transmitted light. The control device is configured to detect resonance frequencies in at least two quantum interference states from the transmitted light, and control the frequency determination process based on the detected resonance frequencies in the at least two quantum interference states and magnetic field information representing preset variation amounts of the resonance frequencies in the at least two quantum interference states with respect to a magnetic field.

Further, a computer program as an aspect of the present invention includes instructions for causing a control unit in a quantum interference device to execute a following process, and the quantum interference device includes a light generating unit configured to generate an excitation light having at least two frequency components, an alkali metal atom cell to which the excitation lights are emitted, a light detecting unit configured to detect a transmitted light from the alkali metal atom cell, and the control unit configured to execute a frequency determination process to determine a resonance frequency in a quantum interference state to be a reference based on the transmitted light. The following process is to detect resonance frequencies in at least two quantum interference states from the transmitted light, and control the frequency determination process based on the detected resonance frequencies in the at least two quantum interference states and magnetic field information representing preset variation amounts of the resonance frequencies in the at least two quantum interference states with respect to a magnetic field.

With the configurations as described above, the present invention can realize high frequency stability in response to a magnetic field variation while achieving the miniaturization of a quantum interference device.

EXAMPLE EMBODIMENT

First Example Embodiment

A first example embodiment of the present invention will be described with reference to FIGS. 1 to 12. First, with reference to FIGS. 1 to 4, a technique related to the present invention will be described.

There are several types of atomic oscillators, which are devices for measuring time with high accuracy. For example, there is a type of oscillation using the quantum interference effect as described below.

Figure 1:
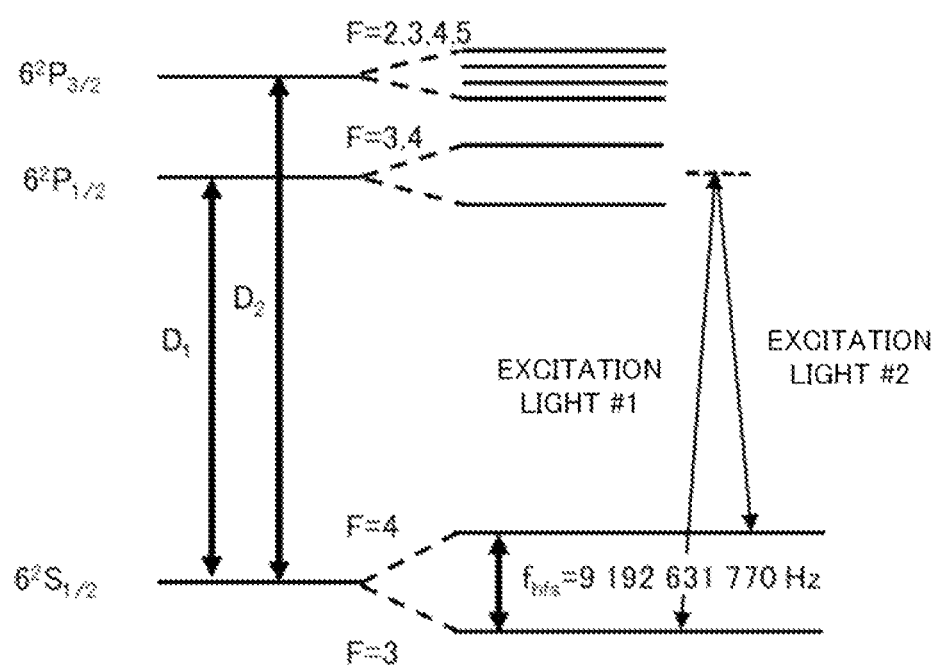
FIG. 1 is a figure showing a hyperfine structure of a cesium atom.

FIG. 1 is a figure showing part of a hyperfine structure of a cesium atom. A cesium atom, which is an alkali metal atom, has a ground level of $6^2S_{1/2}$ and an excited level of $6^2P_{1/2}$ as a result of an interaction of the total angular momentum of electrons and the nuclear spin as shown in FIG. 1. That is to say, in this case, a cesium atom has a ground level of $6^2S_{1/2}$ with two levels of F=3, 4 and an excited level of $6^2P_{1/2}$ with two levels of F=3, 4. The transition frequency between F=3 and F=4 of $6^2S_{1/2}$ that is the ground level (the transition frequency between the ground levels) is defined as $f_{hfs}$=9192631770 Hz in a state where all variation factors are eliminated. By using time information obtained from this frequency $f_{hfs}$, it is possible to realize a second based on the SI units (International System of Units). This transition frequency between the ground levels shifts due to factors such as an interaction with the external electromagnetic field and a collision between the cesium atom and buffer gas. In particular, a transition frequency change caused by a static magnetic field is called the Zeeman shift.

When a cesium atom at the ground level is irradiated with a resonance light having a frequency corresponding to the energy difference between the levels, the cesium atom may absorb the resonance light and transition to the excited level. As the reverse process, a cesium atom at the excited level may emit a resonance light and transition to the ground level. Herein, a resonance light having a frequency corresponding to the energy difference between the ground level of $6^2S_{1/2}$ and the excited level of $6^2P_{1/2}$ is referred to as a Di line.

In particular, three levels including the two ground levels of F=3, 4 of $6^2S_{1/2}$ and either of the excited levels of F=3, 4 of $6^2P_{1/2}$ are referred to as the A-type three levels because A-type transition due to the absorption and emission of the Di line is possible. It is assumed that a transition between F=3 of $6^2S^{1/2}$ and one of the excited levels of $6^2P_{1/2}$ that are included by the A-type three levels is a transition #1, and light having a frequency that is near-resonant to the transition #1 is an excitation light #1. That is to say, the frequency of the excitation light #1 is identical to the transition frequency of the transition #1, or is different by a certain detuning frequency that is sufficiently small relative to the transition frequency of the transition #1. Moreover, it is assumed that a transition between F=4 of $6^2S_{1/2}$ and one of the excited levels of $6^2P_{1/2}$ that are included by the A-type three levels is a transition #2, and light having a frequency that is near-resonant to the transition #2 is an excitation light #2. That is to say, the frequency of the excitation light #2 is identical to the transition frequency of the transition #2, or is different by a certain detuning frequency that is sufficiently small relative to the transition frequency of the transition #2. Herein, it will be considered to irradiate a gaseous cesium atom with these excitation lights (the excitation light #1 and the excitation light #2) at the same time. At the time, in a case where the difference frequency between the emitted excitation light #1 and excitation light #2 matches with the transition frequency of the two ground levels (F=3 of $6^2S_{1/2}$ and F=4 of $6^2S_{1/2}$), a quantum coherence state (dark resonance state) of the two ground levels is formed. This causes a quantum interference effect (called CPT (Coherent Population Trapping)) by which excitation to the excited level is suppressed.

Figure 2:
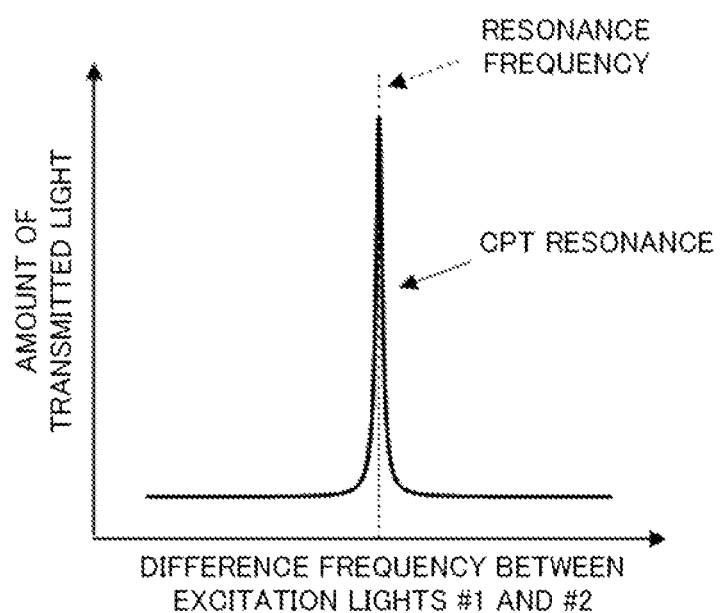
FIG. 2 is a figure of a CPT resonance appearing in a transmitted light spectrum.

FIG. 2 is a schematic diagram of a CPT resonance that appears in a transmitted light spectrum. For example, in the case of measuring a transmitted light spectrum when detecting a transmitted light of a cesium atom while sweeping the difference frequency between the excitation light #1 and the excitation light #2, when the difference frequency matches with the transition frequency between the ground levels, the amount of the transmitted light reaches a peak value and a CPT resonance is detected as shown in FIG. 2. The difference frequency between the excitation lights at the time is called a resonance frequency. By detecting the resonance frequency of the CPT resonance and controlling so that the difference frequency between the excitation lights matches with the transition frequency between the two ground levels, a high-precision atomic oscillator utilizing the quantum interference effect is realized. Although a cesium atom is used as an example herein, alkali metal atoms with similar atomic structures, such as rubidium, sodium and potassium, can also be used to realize atomic oscillators that utilize the same quantum interference effect.

In the abovementioned CPT-type atomic oscillator, a resonance frequency of a CPT resonance is used as a reference for an oscillation frequency. Herein, in order to realize a precise atomic oscillator, it is required to consider the Zeeman shift, in which energy under a magnetic field varies in accordance with the magnetic quantum number.

Figure 3:
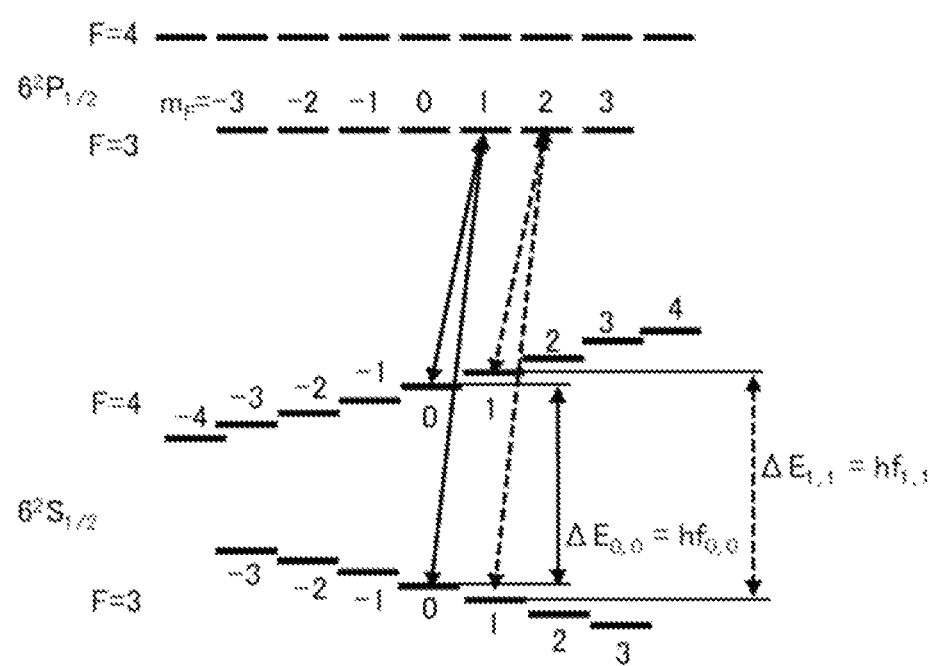
FIG. 3 is a figure showing a hyperfine structure of a cesium atom split under a magnetic field.
Figure 4:
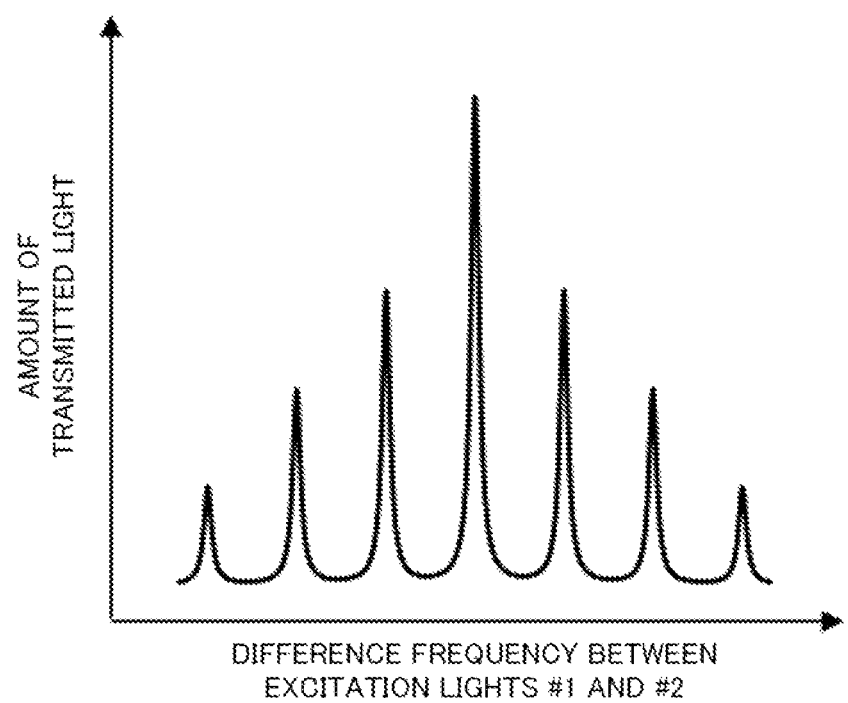
FIG. 4 is a figure of a plurality of CPT resonances with different resonance frequencies appearing in a transmitted light spectrum.

When an external magnetic field is applied to a cesium atom, the level of F=3 of $6^2S_{1/2}$ splits into seven magnetic sublevels $m_F$=0, ±1, ±2, ±3 as a result of the Zeeman shift as shown in FIG. 3. Also, the level of F=4 of $6^2S_{1/2}$ splits into nine magnetic sublevels $m_F$=0, ±1, ±2, ±3, ±4. As a result, the transition frequencies between the magnetic sublevels are different from each other, so that a plurality of CPT resonances with different resonance frequencies can be detected under a condition that a magnetic field is applied to a cesium atom. Herein, for simplicity, a transmitted light spectrum due to a dark resonance state formed by a magnetic sublevel pair |F=3, $m_F$=i⟩ and |F=4, $m_F$=j⟩ will be referred to as a "(i,j) resonance". A CPT resonance to be detected is selected, for example, by the polarization state of the excitation light. As an example, in a case where the polarization state of the excitation light is right circular polarization or left circular polarization, a (i, i) resonance with equal magnetic quantum numbers of F=3 and F=4 of $6^2S_{1/2}$ is detected. FIG. 4 is a schematic diagram of a plurality of CPT resonances with different resonance frequencies appearing in a transmitted light spectrum.

In general, in an atomic oscillator that requires high frequency stability, it is preferable to detect a CPT resonance with a small variation in resonance frequency to a magnetic field and use the CPT resonance to control the oscillation frequency. For example, the (0, 0) resonance, which is immune to the first-order Zeeman shift that is an energy variation proportional to the strength of the magnetic field, is widely used in a cesium atom CPT-type atomic oscillator. However, the (0, 0) resonance is affected by the second-order Zeeman shift, which is proportional to the square of the strength of the magnetic field. The (0, 0) resonance causes a frequency variation of approximately 0.043 Hz/µT² to the magnetic field and is not completely insensible to the magnetic field. Therefore, in order to provide a compact-size atomic oscillator, it is preferable to provide it with an oscillation mechanism with high frequency stability against an unintended magnetic field variation.

In view of the above, this example embodiment intends to solve the problem of decrease in the frequency stability of a quantum interference device and an atomic oscillator due to the unintended magnetic field variation described above. That is to say, with the technique according to this example embodiment, a quantum interference device and an atomic oscillator equipped with a stabilizing mechanism to increase the frequency stability against a variation in the magnetic field occurring inside a cell of alkali metal atomic gas can be provided as will be described later.

[Outline of First Example Embodiment]

Next, the outline of the first example embodiment will be described with reference to FIGS. 5 to 8.

Figure 5:
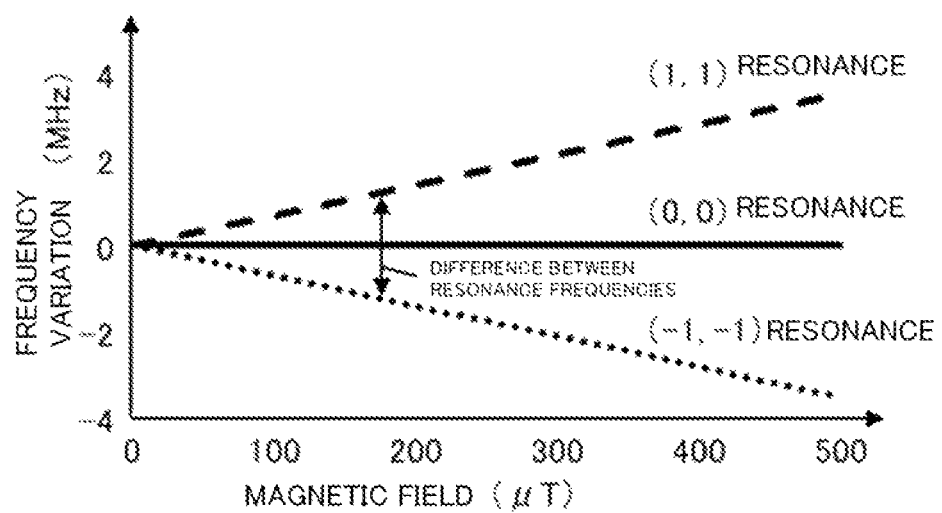
FIG. 5 is a figure showing responses of a (0, 0) resonance frequency, a (1, 1) resonance frequency and a (−1, −1) resonance frequency to the magnetic field.
Figure 6:
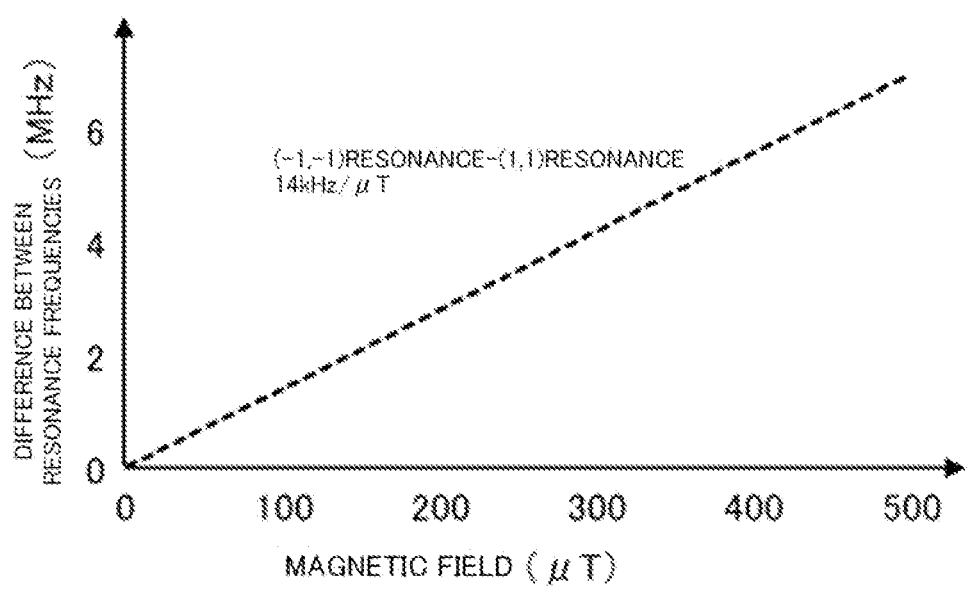
FIG. 6 is a figure showing a response of the difference between the (1, 1) resonance frequency and the (−1, −1) resonance frequency to the magnetic field.

Regarding the ground level of a cesium atom, the magnitude of the first-order Zeeman shift is sufficiently larger than the magnitude of the second-order and higher Zeeman shift in a magnetic field region of 1 mT or less. Therefore, the magnitude of the Zeeman shift is substantially linear with respect to the magnetic field, and the (i, i) resonance frequency varies substantially linearly with respect to the magnetic field as shown in FIG. 5. For example, the magnitude of the magnetic field variation of the (1, 1) resonance frequency is approximately 7 kHz/µT, and the magnitude of the magnetic field variation of the (−1, −1) resonance frequency is approximately −7 kHz/µT. That is to say, the difference between the (1, 1) resonance frequency and the (−1, −1) resonance frequency is substantially linear with respect to the magnetic field as shown in FIG. 6, and is approximately 14 kHz/µT.

Figure 7:
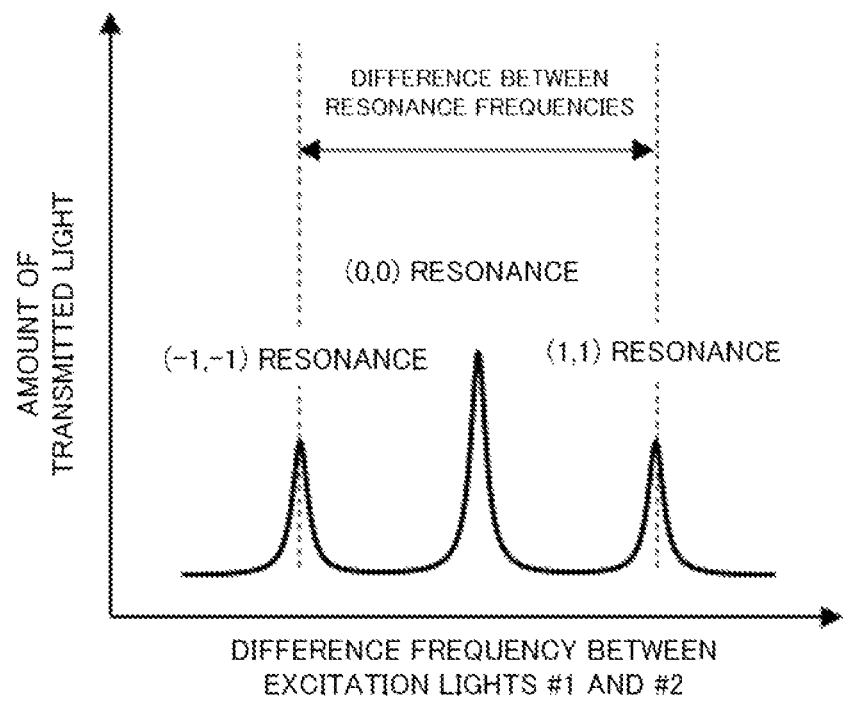
FIG. 7 is a figure showing a method for detecting the difference between resonance frequencies by observing a plurality of different CPT resonances.

As an example, in a case where the polarization state of the excitation light is right circular polarization or left circular polarization, it is possible to detect the (i, i) resonance by making the difference frequency between the excitation lights match with the resonance frequency of the (i, i) resonance. For example, in the case of detecting the (0, 0) resonance, it is possible to detect two or more different CPT resonances with known change amounts of the resonance frequencies with respect to magnetic field variations, such as the (1, 1) resonance and the (−1, −1) resonance, with the same optical arrangement. That is to say, if the sweep range of the difference frequency between the excitation lights is taken so as to include a plurality of CPT resonance frequencies, a transmitted light spectrum as shown in FIG. 7 is obtained. From the transmitted light spectrum, the difference between the (1, 1) resonance frequency and the (−1, −1) resonance frequency can be determined.

Figure 8:
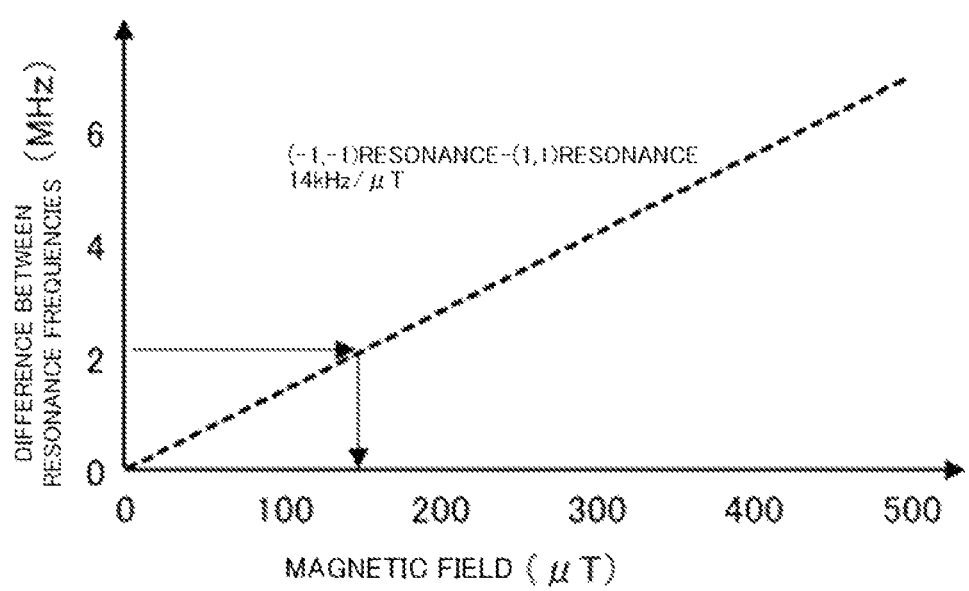
FIG. 8 is a figure showing a method for calculating a magnetic field based on the difference between resonance frequencies.

The variation of the difference between the (1, 1) resonance frequency and the (−1, −1) resonance frequency in accordance with the strength of the magnetic field is shown by FIG. 8. By detecting the (1, 1) resonance and the (−1, −1) resonance and calculating the difference between the resonance frequencies, it is possible to determine the strength of the magnetic field occurring at the position of the cesium atom based on FIG. 8.

As will be described later, the quantum interference device according to this example embodiment includes: a space to which a static magnetic field whose magnetic field strength is controllable is applied; an alkali metal atom cell with alkali metal atoms sealed therein arranged at a predetermined position in the space; a light generating unit configured to generate an excitation light which enters the alkali metal atom cell and has at least two frequency components and a difference frequency of which is substantially equal to a transition frequency between ground states; and a control device configured to store a variation amount of a resonant frequency of a quantum interference effect at a specific Zeeman sublevel according to the magnetic field strength.

In the quantum interference device having the above configuration, in detection of a CPT resonance by a method according to this example embodiment, which will be described later, a variation in the resonance frequency to an unintended variation of the magnetic field at the position of the atomic gas cell decreases. Therefore, it is possible to provide an atomic oscillator with high frequency stability to a magnetic field variation. In particular, in the following example embodiments, by controlling the strength of a static magnetic field applied to the position of the gas cell based on the strength of the magnetic field at the position of the gas cell obtained from the frequency difference between the (1, 1) resonance frequency and the (−1, −1) resonance frequency, it is possible to provide a quantum interference device and an atomic oscillator with high stability of the oscillation frequency to the variation of the magnetic field at the position of the gas cell including an influence by the external environment.

[Details of First Example Embodiment]

Below, the details of the first example embodiment will be described mainly with reference to FIGS. 9 to 12. For clarity of explanation, the following descriptions and drawings are appropriately omitted and simplified. Also, in the drawings, the same elements are denoted by the same reference numerals, and redundant descriptions will be omitted as necessary.

[Configuration]

Figure 9:
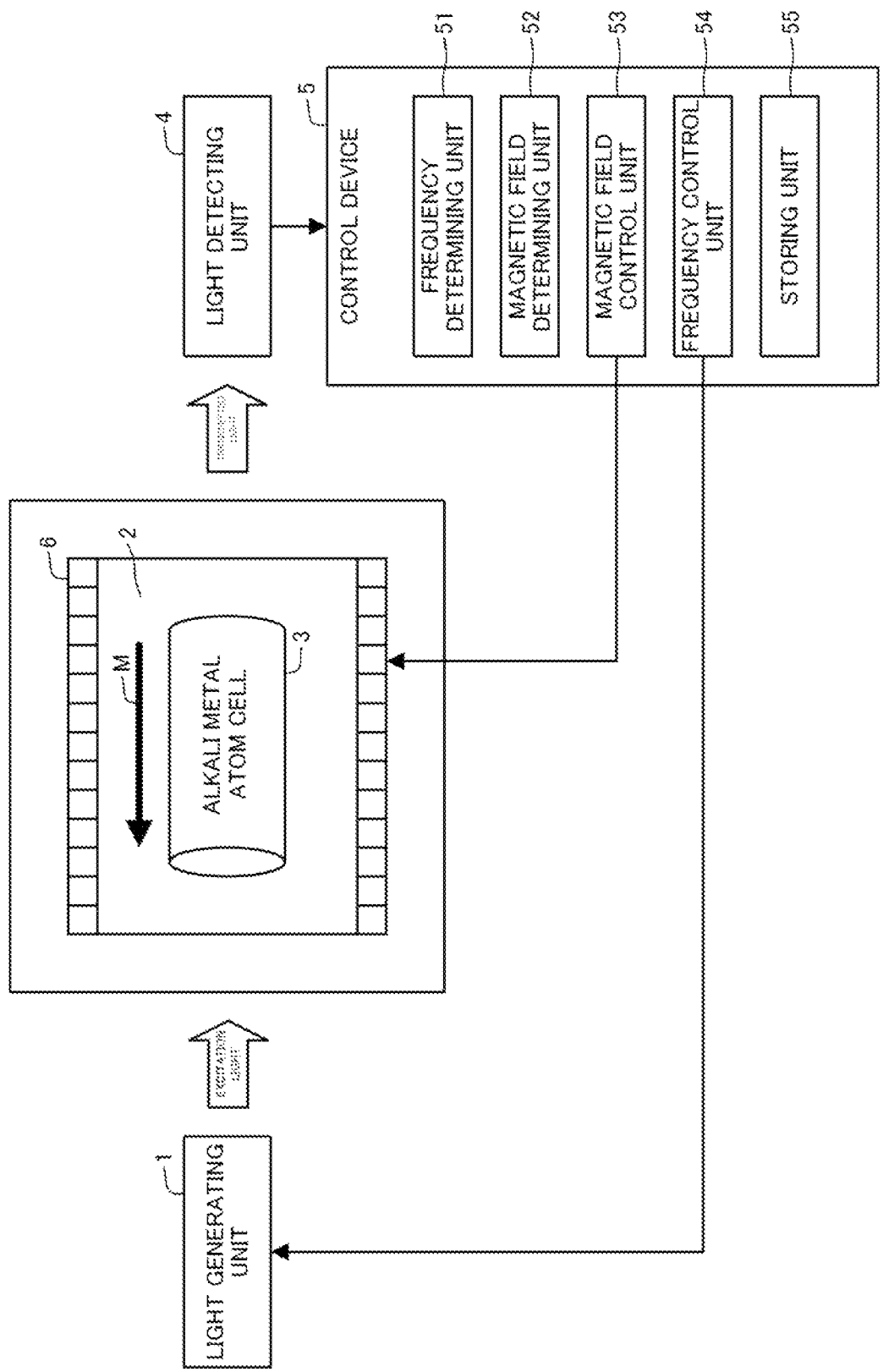
FIG. 9 is a functional block diagram of a quantum interference device according to a first example embodiment.

FIG. 9 is a functional block diagram of the quantum interference device according to the first example embodiment. The quantum interference device according to this example embodiment includes a light generating unit 1, a space 2 to which a controllable magnetic field can be applied, an alkali metal atom cell 3, a light detecting unit 4, and a control device 5. Below, the respective components will be described in detail.

The light generating unit 1 generates an excitation light having at least two different frequency components. Moreover, the light generating unit 1 has a mechanism that can control the difference frequency between the frequency components of the excitation light based on output by the control device 5.

Specifically, the excitation light generated by the light generating unit 1 has at least two different frequency components as described above. The excitation light may have three or more different frequency components, and the difference frequency between two of the frequency components is substantially equal to the transition frequency between magnetic sublevels forming a dark resonance state of alkali metal atoms. The excitation light is realized by, for example, generating sidebands by modulating a single-wavelength light oscillated from a semiconductor laser or the like at a frequency approximately equal to ½ of the transition frequency between the ground levels. At the time, the control of the difference frequency of the excitation light is realized by a mechanism that controls the modulation frequency. Alternatively, the excitation light is realized by, for example, combining two single-wavelength lights oscillated from two semiconductor lasers or the like each having a mechanism for controlling the difference frequency. The light generating unit 1 has a mechanism that can control the difference frequency of the excitation light within a range such that a CPT resonance to be a reference for frequency oscillation and a CPT resonance to be a reference for magnetic field evaluation can be detected.

Figure 10:
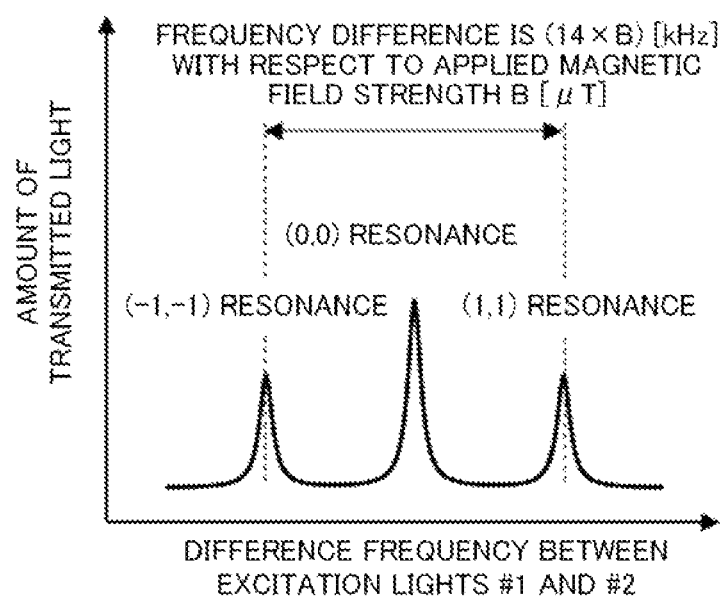
FIG. 10 is a figure showing a variation of the difference between resonance frequencies in accordance with the strength of the magnetic field at the position of the atomic gas.

The control range of the difference frequency of the excitation light required here varies in accordance with the strength of the magnetic field at the position of the gas cell. For example, in the case of using the (1, 1) resonance and the (−1, −1) resonance as the CPT resonances to be the reference for magnetic field evaluation, the difference between the resonance frequencies varies substantially in proportion to the strength of the magnetic field at the position of the gas cell as shown in FIG. 10. As an example, in a case where the strength of the magnetic field at the position of the gas cell is expected to be approximately 100 μT, it is preferable to have a mechanism that can control the difference frequency of the excitation light 1 in the range of 1400 kHz or higher, for example, approximately 1500 kHz.

A static magnetic field M substantially parallel to the same direction as or the opposite direction to the incident direction of the excitation light is applied to the space 2 as indicated by an arrow M in FIG. 9. That is to say, the space 2 functions as a magnetic field application space. Specifically, the space 2 to which the static magnetic field is applied includes a region including the inside of the alkali metal atom cell 3. For example, a solenoid coil 6 is arranged in a direction parallel to the incident direction of the excitation light so as to cover the alkali metal atom cell 3, and the inside the solenoid coil 6 is defined as the space 2. In this case, the control of the direction and strength of the static magnetic field applied to the space 2 is realized by adjusting the direction and magnitude of an electric current applied to the solenoid coil 6 based on the output by the control unit 5. Consequently, a magnetic field substantially parallel to the same direction or the opposite direction to the incident direction of the excitation light is applied to the space 2. The space 2 including the solenoid coil 6 is further covered with a magnetic shield.

In the alkali metal atom cell 3, alkali metal atoms are enclosed. The alkali metal atom cell 3 is arranged at a predetermined position inside the space 2. Specifically, in the alkali metal atom cell 3, alkali metal atoms having the Λ-type three levels are enclosed. The alkali metal atoms enclosed in the alkali metal atom cell 3 may be, for example, cesium atoms, rubidium atoms, sodium atoms, or potassium atoms. The material forming the container of the alkali metal atom cell 3 is preferably a transparent material that has a high excitation light transmittance, such as glass. In the alkali metal atom cell 3, other than the alkali metal atoms, a buffer gas that does not contribute to the absorption of the excitation light may be enclosed for the purpose of reducing an impact of the collision of the gaseous alkali metal atoms with the wall surface of the container. Moreover, the alkali metal atom cell 3 may include a temperature control device that does not block the optical path of the excitation light for the purpose of controlling the saturated vapor pressure of the gaseous alkali metal atoms. The temperature control device is formed by, for example, a resistive heater. The excitation light enters the alkali metal atom cell 3, and part of the incident light passes through the alkali metal atom cell 3. Although not shown, a collimator lens and a λ/2 waveplate are arranged on the entering side of the alkali metal atom cell 3, and a collimator lens is arranged on the emitting side.

The light detecting unit 4 detects light (transmitted light) that has passed through the alkali metal atom cell 3. The light detecting unit 4 is realized by using a photodiode, for example.

The control device 5 (control unit) is formed by an information processing device including an operation unit (not shown) and a storing unit 55. The control device 5 includes, as shown in FIG. 9, a frequency determining unit 51, a magnetic field determining unit 52, a magnetic field control unit 53 and a frequency control unit 54 that are structured by execution of a program by the operation unit.

In the storing unit 55, magnetic field information is stored, such as the amount of variation of the resonance frequency of a CPT resonance to be a reference for the oscillation frequency due to the magnetic field, and the amount of variation of the resonance frequency of a CPT resonance to be used for magnetic field evaluation due to the magnetic field. The frequency control unit 54 controls the difference frequency of the excitation light generated by the light generating unit 1. The control of the difference frequency is realized by controlling the frequency of a modulation signal for generating sidebands of a single-wavelength light oscillated from a semiconductor laser or the like, for example. The magnetic field control unit 53 controls the direction and strength of the magnetic field M applied to the space 2. The control of the direction and strength of the magnetic field M can be realized by controlling the direction and magnitude of an electric current applied to the solenoid coil 6, for example.

The control device 5 has a function to execute processing described in the following description of the operation of the respective units 51 to 54, and performs a frequency determination process to determine the resonance frequency of the CPT resonance to be the reference based on the transmitted light detected by the light detecting unit 4.

[Operation]

Figure 11:
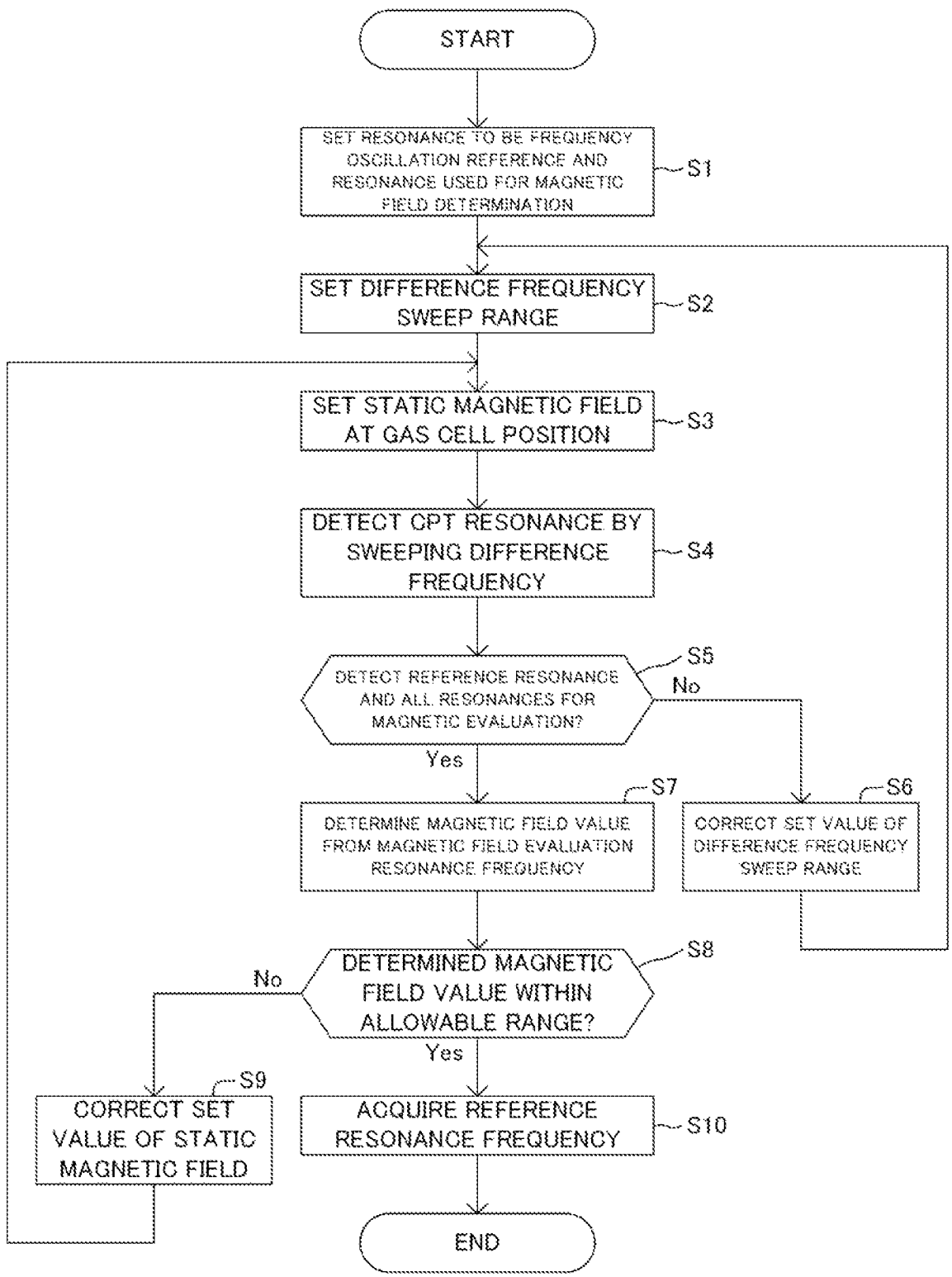
FIG. 11 is a flowchart showing an operation of the quantum interference device according to the first example embodiment.

FIG. 11 is a flowchart showing an operation of the quantum interference device according to the first example embodiment. The flowchart of FIG. 11 shows a control method (regulation method, detection method) executed by the quantum interference device according to the first example embodiment. The operation in this example embodiment will be described along the flowchart of FIG. 11.

In detecting a quantum interference effect, the quantum interference device detects a transmitted light while sweeping the difference frequency of excitation lights. First, the quantum interference device sets a CPT resonance to be a reference for an oscillation frequency and a CPT resonance to be used for magnetic field evaluation (step S1). The quantum interference device stores the amounts of variations of the resonance frequencies of the CPT resonances due to the magnetic field into the storing unit 55. As the resonance to be a reference for an oscillation frequency, a CPT resonance whose variation in the resonance frequency to the magnetic field is small can be selected. For example, the (0, 0) resonance, which is immune to the first-order Zeeman shift, can be used. Moreover, for example, either the (−1, 1) resonance or the (1, −1) resonance, on which an influence of the first-order Zeeman shift is as small as that of the second-order or higher-order Zeeman shift, may be used. As the resonance to be used for magnetic field evaluation, at least two CPT resonances whose variations in the resonance frequencies to the magnetic field are known can be selected. For example, the (1, 1) resonance and the (−1, −1) resonance can be selected. Alternatively, for example, the (0, 2) resonance and the (−2, 0) resonance can be selected.

Figure 12:
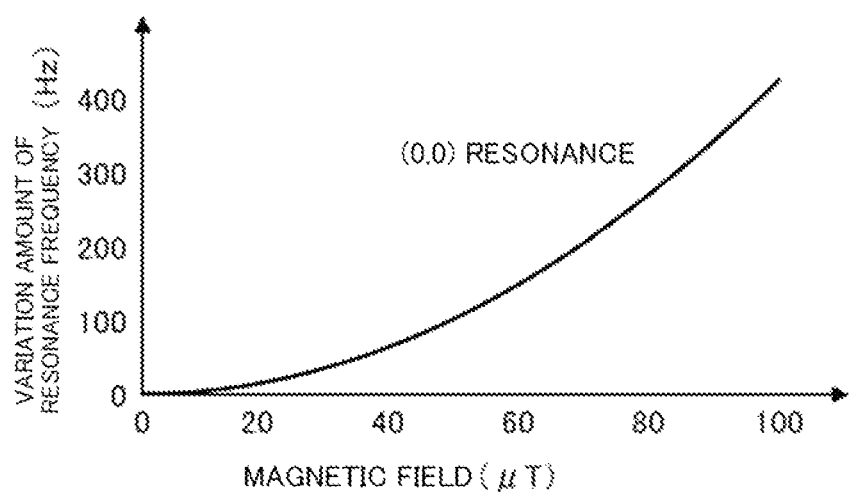
FIG. 12 is a figure showing a response of the (0, 0) resonance frequency to the magnetic field.

The amount of variation of the resonance frequency of the CPT resonance to be used for magnetic field evaluation due to the magnetic field described above is, for example, the magnetic field information as shown in FIG. 6 described above. Moreover, the amount of variation of the resonance frequency of the CPT resonance to be the reference for the oscillation frequency due to the magnetic field is, for example, magnetic field information as shown in FIG. 12, which will be described later.

Subsequently, the quantum interference device sets the range of sweep of the difference frequency of the excitation lights by the frequency control unit 54 to a predetermined value (step S2). Preferably, the quantum interference device sets the sweep range to a range expected to include the resonance frequency of the resonance to be the reference and the resonance frequencies of all the resonances used for magnetic field evaluation. As an example, in a case where the (1, 1) resonance and the (−1, −1) resonance are selected as the resonances to be used for magnetic field evaluation, the difference between the resonance frequencies is, as shown in FIG. 10, 14×B (kHz), where B (μT) is the strength of a magnetic field parallel to the incident direction of the excitation light at the alkali atom position. The sweep range of the difference frequency of the excitation lights is set to a range wider than the difference between the (1, 1) resonance frequency and the (−1, −1) resonance frequency. For example, in a case where a magnetic field strength at the position of the gas cell is expected to be approximately 100 μT, the difference between the (1, 1) resonance frequency and the (−1, −1) resonance frequency is expected to be approximately 1400 kHz, so that it is preferable to set the sweep range of the difference frequency of the excitation lights to 1400 kHz or more.

Next, the quantum interference device sets the strength of a static magnetic field (applied magnetic field) applied to the alkali metal atom cell 3 controlled by the magnetic field control unit 53 to a predetermined value (step S3). In a case where the magnetic field at the alkali atom position is zero, the magnitude of the Zeeman shift is zero for all the magnetic sublevels, so that all the (i, j) resonances have the same resonance frequency. In this case, the CPT resonance to be the reference for the oscillation frequency is superposed on another CPT resonance and then greatly affected by an unintended magnetic field variation, which makes it difficult to detect a narrow resonance signal. For this reason, there is a need to apply a static magnetic field to an extent that the superposition of the CPT resonance to be the reference for the oscillation frequency on the other CPT resonance is canceled. For example, in a case where the (0, 0) resonance is selected as the CPT resonance to be the reference for the oscillation frequency, a static magnetic field of approximately 25 μT is typically applied. Moreover, for example, the strength of the applied magnetic field may be set to a value that is expected to minimize the magnetic field shift of the resonance frequency of the resonance to be the reference for the oscillation frequency. In a case where the (−1, 1) resonance is selected as the CPT resonance to be the reference for the oscillation frequency, when a static magnetic field of 139 μT is applied, superposition on the other CPT resonance is canceled, and a state where the magnetic field shift of the resonance frequency is minimum is realized.

Under the above conditions, while the frequency control unit 54 sweeps the frequency difference of the excitation lights, the quantum interference device makes the excitation lights enter the alkali metal atom cell 3 and causes the light detecting unit 4 to detect the transmitted light to measure a transmitted light spectrum. Then, the frequency determining unit 51 detects CPT resonances from the detected transmitted light (step S4). Here, the quantum interference device determines whether or not the resonance to be the reference and all the resonances to be used for magnetic field evaluation have been detected from the measured transmitted light spectrum (step S5).

In a case where there is a CPT resonance that has not been detected (No at step S5), the frequency determining unit 51 changes the sweep range of the difference frequency of the excitation lights to a range where it is expected that all the CPT resonances can be detected (step S6). As an example, the frequency determining unit 51 expands the sweep range of the difference frequency of the excitation lights. Alternatively, as an example, the frequency determining unit 51 may shift the sweep range of the difference frequency of the excitation lights to the low frequency side or the high frequency side. Then, the processing flow returns to S2. Specifically, the quantum interference device changes the sweep range of the difference frequency of the excitation lights, and performs the setting of the applied magnetic field and the measurement of the transmitted light spectrum again.

On the other hand, in a case where all the CPT resonances have been detected (Yes at step S5), the magnetic field determining unit 52 determines a magnetic field value at the position of the alkali metal atom cell 3 from the difference of the resonance frequencies of the resonances used for the magnetic field evaluation (step S7). As an example, in a case where the (1, 1) resonance and the (−1, −1) resonance are selected as the resonances used for magnetic field evaluation, the difference between the resonance frequencies varies in accordance with the magnetic field as shown in FIG. 10. Assuming that the difference between the resonance frequencies is $\Delta f$ (Hz), the magnetic field value at the position of the alkali metal atom cell 3 is determined as $\Delta f/1400$ (µT). Here, the magnetic field determining unit 52 determines whether or not the determined magnetic field value is within a predetermined allowable range (step S8). This allowable range may be, for example, a magnetic field range where a variation in the resonance frequency of the resonance to be the reference, which occurs when an unintended magnetic field variation occurs, falls within a certain frequency range. As an example, the (0, 0) resonance frequency varies with the magnetic field strength as shown in FIG. 12. In a case where the magnetic field strength is 25 µT, when an unintended magnetic field variation of 1 µT occurs, a frequency variation of 2.1 Hz is caused. The greater the magnetic field strength is, the greater the amount of frequency variation with respect to the same magnetic field variation is. For this reason, by setting the allowable magnetic field range, it is possible to limit the amount of frequency variation that may occur. Also, the allowable magnetic field range may be a range that includes a magnetic field that minimizes the variation of the reference frequency of the CPT resonance to be the reference. The information shown in FIG. 12 is information representing the amount of variation of the resonance frequency to be the reference with respect to the magnetic field, and is stored in the storing unit 55 as described above.

In a case where the determined magnetic field value at the position of the alkali metal atom cell 3 falls outside the allowable range (No at step S8), the magnetic field determining unit 52 corrects the set value of the applied magnetic field (step S9). For example, in a case where the determined magnetic field value is smaller than the allowable range, the magnetic field determining unit 52 sets the applied magnetic field to be larger. For example, adjustment of the applied magnetic field at the position of the alkali metal atom cell 3 is realized by changing the value of an electric current applied to the solenoid coil 6. Then, the quantum interference device returns the processing flow to step S3, and performs the measurement of the transmitted light spectrum again.

On the other hand, in a case where the magnetic field value determined at the position of the alkali metal atom cell 3 is within the allowable range (Yes step S8), the magnetic field determining unit 52 ends adjustment of the sweep range of the difference frequency of the excitation lights and the applied magnetic field, and the frequency determining unit 51 acquires the resonance frequency of the CPT resonance to be the reference (step S10). To the resonance frequency of the CPT resonance to be the reference, a correction term based on the magnetic field value determined at the position of the alkali metal atom cell 3 may be added. For example, in a case where the (0, 0) resonance is selected as the CPT resonance to be the reference, a resonance frequency variation shown in FIG. 12 is caused with respect to the magnetic field strength at the position of the alkali metal atom cell 3. For example, under the magnetic field of 25 µT, the (0, 0) resonance frequency shifts +26.7 Hz. In this case, to the acquired resonance frequency, a correction term of −26.7 Hz may be added.

[Effect]

According to the quantum interference device according to the first example embodiment, by generating an applied magnetic field adjusted by the above method at the position of the alkali metal atom cell 3, an unintended influence of the magnetic field is resolved, and detection of the CPT resonance to be the reference under the stabilized resonance frequency is realized.

<Second Example Embodiment>

Next, a second example embodiment of the present invention will be described with reference to FIGS. 13 to 14. In the second example embodiment, a magnetic field strength at the position of the alkali metal atom cell 3 is determined, and a resonance frequency including a correction term corresponding to the magnetic field strength is acquired. For simplicity of explanation, the following description and drawings are omitted and simplified as necessary. Moreover, in the drawings, the same elements are denoted by the same reference numerals, and a redundant description is omitted as necessary.

[Configuration]

Figure 13:
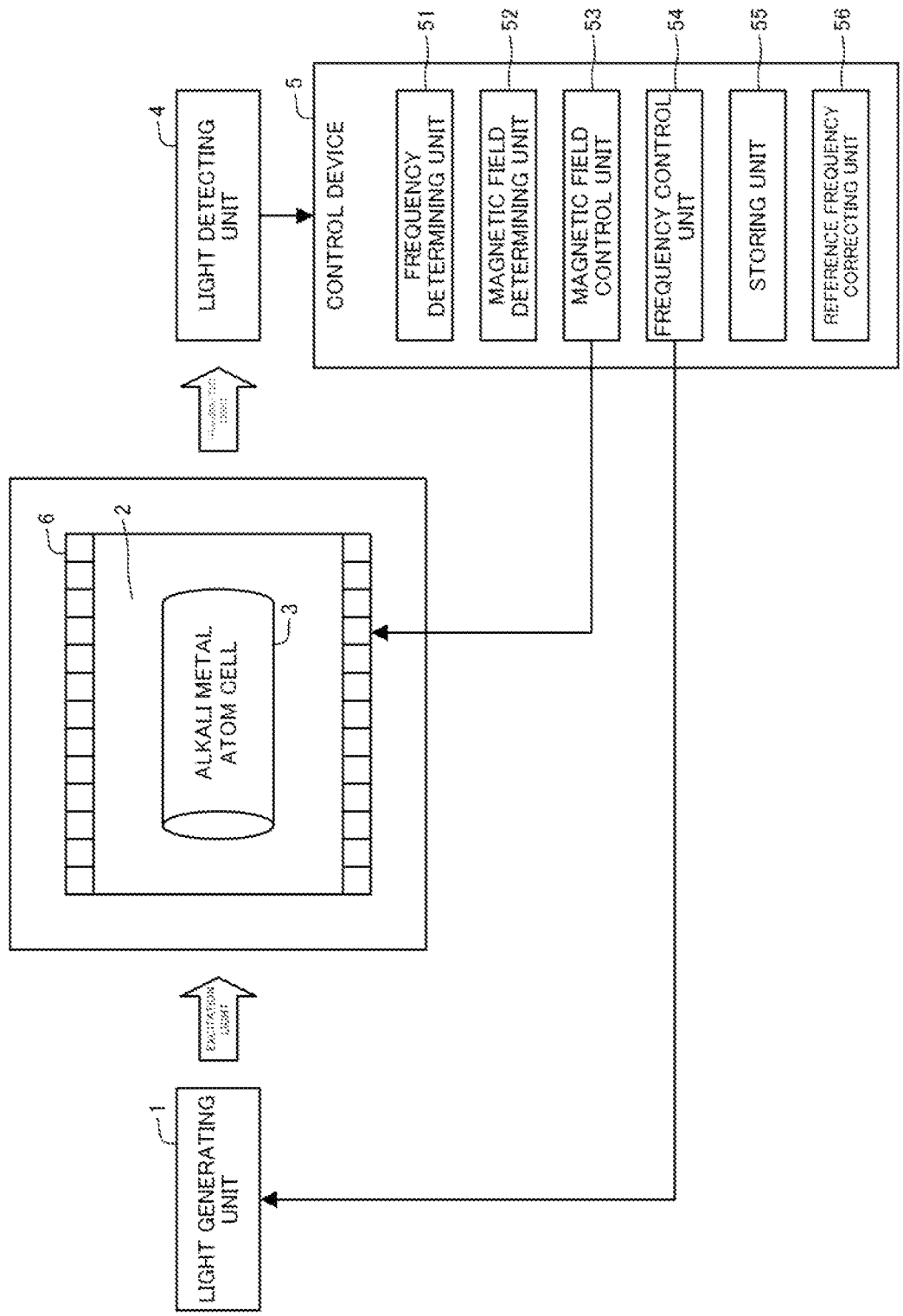
FIG. 13 is a functional block diagram of a quantum interference device according to a second example embodiment.

FIG. 13 is a functional block diagram of a quantum interference device according to a second example embodiment. The quantum interference device according to this example embodiment has the same configuration as in the first example embodiment described above, and is different in that the control device 5 further includes a reference frequency correcting unit 56. The reference frequency correcting unit 56 can be realized by execution of a program by an operation unit of the control device 5.

The reference frequency correcting unit 56 corrects the resonance frequency of the CPT resonance to be the reference based on the magnetic field strength determined in the space where the alkali metal atom cell is installed. Specifically, the reference frequency correcting unit 56 specifies a variation value corresponding to the determined magnetic field strength based on the information of the variation amount of the resonance frequency of the CPT resonance to be the reference with respect to the magnetic field as shown in FIG. 12 stored in the storing unit 55 as described before, and adds a frequency correction value so as to cancel the variation value. The reference frequency correcting unit 56 may be realized by an operation unit installed outside the control device 5.

[Operation]

Figure 14:
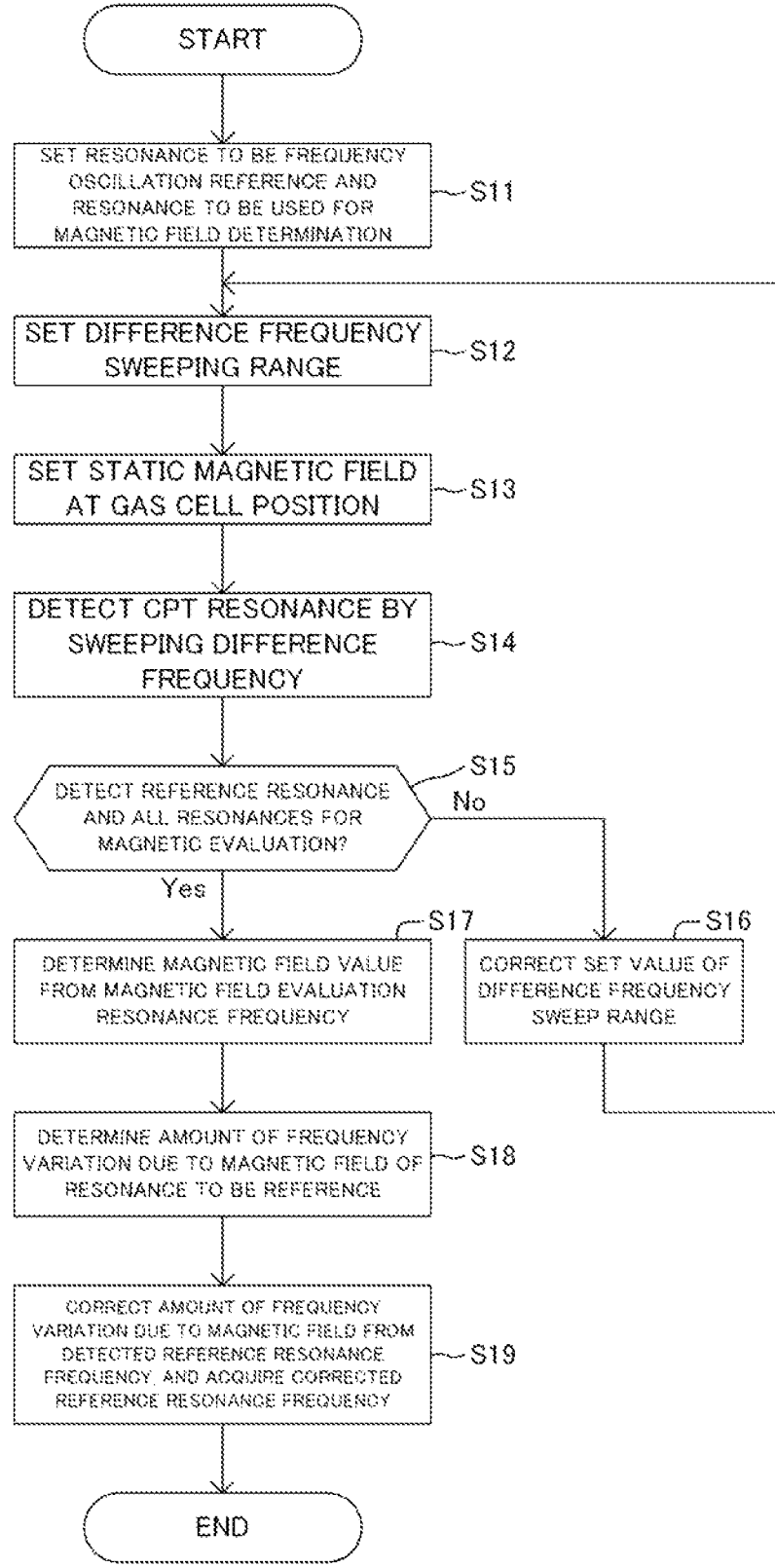
FIG. 14 is a flowchart showing an operation of the quantum interference device according to the second example embodiment.

FIG. 14 is a flowchart showing an operation of the quantum interference device according to the second example embodiment. The flowchart of FIG. 14 shows a control method (adjustment method, detection method) executed by the atomic oscillator according to the second example embodiment. An operation in this example embodiment will be described along the flowchart of FIG. 14.

First, the quantum interference device sets a resonance to be a reference for an oscillation frequency and a resonance to be used for magnetic field evaluation (step S11). As the resonance to be a reference for an oscillation frequency, a CPT resonance whose variation in the resonance frequency to the magnetic field is small can be selected. For example, the (0, 0) resonance, the (−1, 1) resonance, or the (1, −1) resonance can be used. Moreover, as the resonance used for magnetic field evaluation, at least two CPT resonances whose variations in the resonance frequencies to the magnetic field are known can be selected. For example, the (1, 1) resonance and the (−1, −1) resonance can be selected. Alternatively, for example, the (0, 2) resonance and the (−2, 0) resonance can be selected.

Subsequently, the quantum interference device sets the range of sweep of the difference frequency of the excitation lights to a predetermined value (step S12). Preferably, the quantum interference device sets the sweep range to a range expected to include the resonance frequency of the resonance to be the reference and the resonance frequencies of all the resonances to be used for magnetic field evaluation.

Next, the quantum interference device sets the strength of a static magnetic field (applied magnetic field) applied to the alkali metal atom cell 3 to a predetermined value (step S13). For example, the strength of the applied magnetic field is set to a value that is expected to minimize the magnetic field shift of the resonance frequency of the resonance to be the reference for the oscillation frequency.

Under the above conditions, while sweeping the frequency difference of the excitation lights, the quantum interference device makes the excitation lights enter the alkali metal atom cell 3, and causes the light detecting unit 4 to detect the transmitted light to measure a transmitted light spectrum, and detects CPT resonances (step S14). Here, the quantum interference device determines whether or not the resonance to be the reference and all the resonances to be used for the magnetic field evaluation have been detected from the measured transmitted light spectrum (step S15).

In a case where there is a CPT resonance that has not been detected (No at step S15), the quantum interference device changes the set value of the sweep range of the difference frequency of the excitation lights to a range where it is expected that all the CPT resonances cab be detected (step S16). Then, the quantum interference device returns the processing flow to S12. Specifically, the quantum interference device expands the sweep range of the difference frequency of the excitation lights, and performs the setting of the applied magnetic field and the measurement of the transmitted light spectrum again.

On the other hand, in a case where all the CPT resonances have been detected (Yes at step S15), the quantum interference device ends the adjustment of the sweep range of the difference frequency of the excitation lights, and determines a magnetic field value at the position of the alkali metal atom cell 3 from the difference of the resonance frequencies of the resonances to be used for the magnetic field evaluation (step S17).

Subsequently, the quantum interference device estimates a variation value of the resonance frequency of the CPT resonance to be the reference at the determined magnetic field value (step S18). For example, in a case where the (0, 0) resonance is selected as the CPT resonance to be the reference, as shown in FIG. 12, the (0, 0) resonance causes a frequency variation of approximately 0.043 Hz/μT$^2$ with respect to the magnetic field, so that the quantum interference device can determine a frequency variation amount at a specific magnetic field strength based on the above.

Then, the quantum interference device acquires the resonance frequency of the resonance to be the reference, corrects the value of frequency variation due to the magnetic field, and acquires a reference frequency after the correction (step S19).

[Effect]

According to the quantum interference device of the second example embodiment, the strength of the magnetic field generated at the position of the alkali metal atom cell 3 is determined by the above method, an unintended influence of the magnetic field on the resonance frequency of the CPT resonance to be the reference is canceled, and detection of the stabilized resonance frequency is realized.

<Third Example Embodiment>

Figure 15:
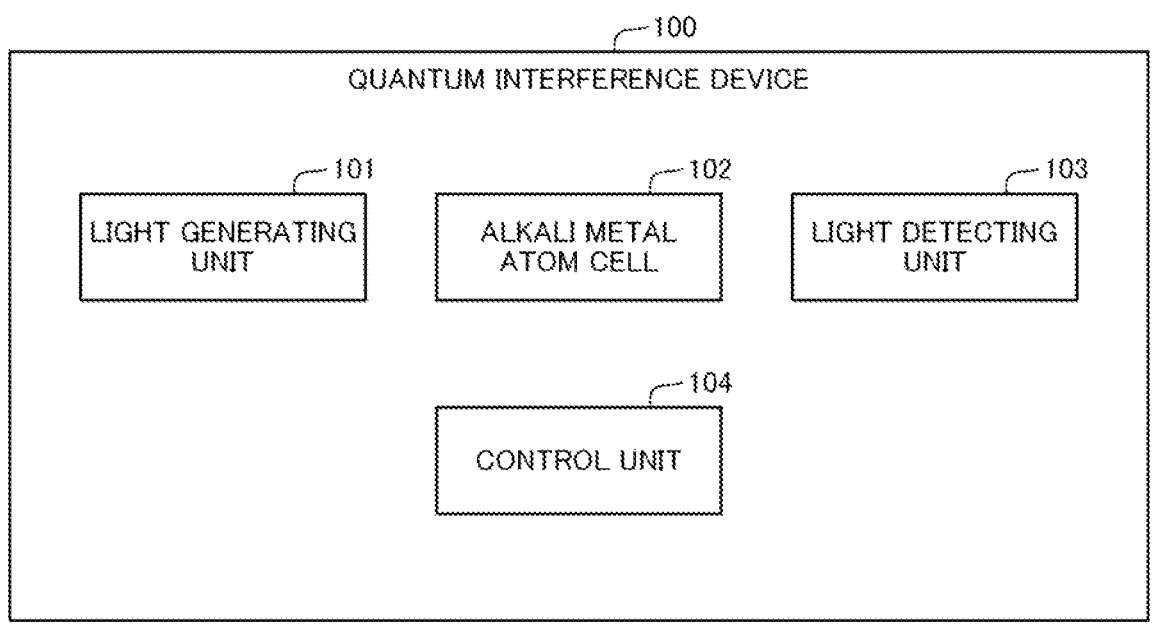
FIG. 15 is a block diagram showing a configuration of a quantum interference device according to a third example embodiment of the present invention.
Figure 16:
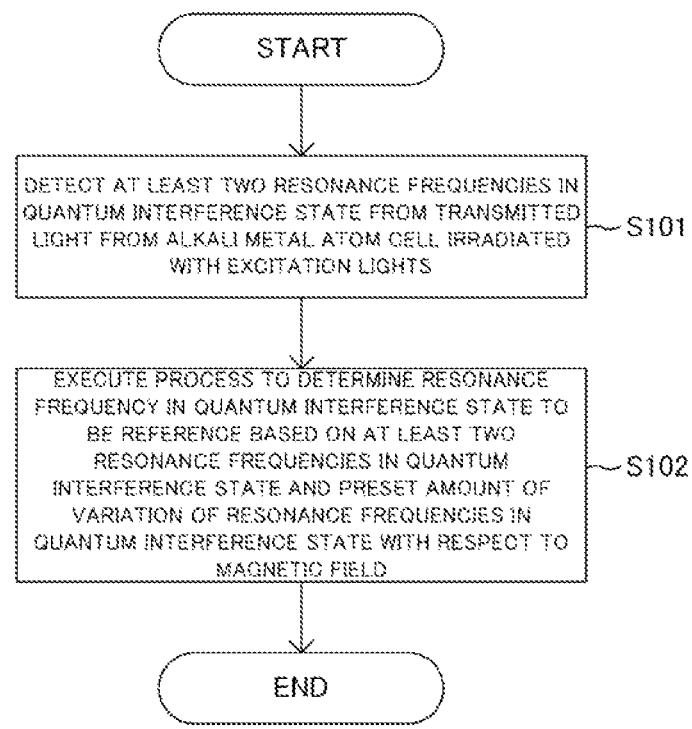
FIG. 16 is a flowchart showing an operation of the quantum interference device according to the third example embodiment of the present invention.

Next, a third example embodiment of the present invention will be described with reference to FIGS. 15 to 16. FIG. 15 is a block diagram showing a configuration of a quantum interference device in a third example embodiment, and FIG. 16 is a flowchart showing an operation of the quantum interference device. In this example embodiment, the outline of configurations of the quantum interference device and the control method described in the above example embodiments is shown.

As shown in FIG. 15, a quantum interference device 100 in this example embodiment includes a light generating unit 101 generating an excitation light having at least two frequency components, an alkali metal atom cell 102 to which the excitation lights are emitted, a light detecting unit 103 detecting a transmitted light from the alkali metal atom cell, and a control unit 104 executing a frequency determination process to determine a resonance frequency in a quantum interference state to be a reference based on the transmitted light. Then, the control unit 104 is configured to detect resonance frequencies in at least two quantum interference states from the transmitted light, and control the frequency determination process based on the detected resonance frequencies in the at least two quantum interference states and magnetic field information representing preset variation amounts of resonance frequencies in at least two quantum interference states with respect to a magnetic field.

Then, as shown in FIG. 16, the control unit 104 with the above configuration executes processes to detect resonance frequencies in at least two quantum interference states from the transmitted light (step S101), and control the frequency determination process based on the detected resonance frequencies in the at least two quantum interference states and magnetic field information representing preset variation amounts of resonance frequencies in at least two quantum interference states with respect to a magnetic field (step S102). The processes executed by the control unit 104 are realized by execution of a program by an operation unit configuring the control unit 104.

As described above, according to the present invention, by using the detected resonance frequencies in the two quantum interference states and the preset variation amounts of the resonance frequencies in the two quantum interference states with respect to the magnetic field, it is possible to determine the strength of a magnetic field generated at the position of the alkali metal atom cell, and execute the frequency determination process to determine a resonance frequency in the quantum interference state to be the reference. Consequently, it is realized to cancel an unintended influence of a magnetic field on the resonance frequency of the CPT resonance to be the reference, and detect a stabilized reference frequency.

Although the present invention has been described above with reference to the example embodiments, the present invention is not limited to the above example embodiments. The configurations and details of the present invention can be changed in various manners that can be understood by one skilled in the art within the scope of the present invention.

<Supplementary Notes>

The whole or part of the example embodiments disclosed above can be described as the following supplementary notes. Below, the outline of a quantum interference device, a control method, and a program according to the present invention will be described. However, the present invention is not limited to the following configurations.

(Supplementary Note 1)

A quantum interference device comprising a light generating unit configured to generate an excitation light having at least two frequency components, an alkali metal atom cell to which the excitation lights are emitted, a light detecting unit configured to detect a transmitted light from the alkali metal atom cell, and a control unit configured to execute a frequency determination process to determine a resonance frequency in a quantum interference state to be a reference based on the transmitted light, wherein the control unit is configured to detect resonance frequencies in at least two quantum interference states from the transmitted light, and control the frequency determination process based on the detected resonance frequencies in the at least two quantum interference states and magnetic field information representing preset variation amounts of the resonance frequencies in the at least two quantum interference states with respect to a magnetic field.

(Supplementary Note 2)

The quantum interference device according to Supplementary Note 1, wherein the control unit stores therein the magnetic field information of specific two quantum interference states, and is configured to detect resonance frequencies in the specific two quantum interference states, determine a magnetic field strength based on a difference of the resonance frequencies and the magnetic field information, and control the frequency determination process based on the determined magnetic field strength.

(Supplementary Note 3)

The quantum interference device according to Supplementary Note 2, wherein the specific two quantum interference states are quantum interference states in which variation amounts of resonance frequencies with respect to a magnetic field are linear.

(Supplementary Note 4)

The quantum interference device according to Supplementary Note 2 or 3, wherein the control unit is configured to detect, from the transmitted light, the resonance frequency in the quantum interference state to be the reference and the resonance frequencies in the specific two quantum interference states in which variation amounts of resonance frequencies with respect to a magnetic field are larger than in the quantum interference state to be the reference.

(Supplementary Note 5)

The quantum interference device according to any of Supplementary Notes 2 to 4, wherein the control unit is configured to control the light generating unit to generate the excitation lights to be emitted to the alkali metal atom cell so as to be able to detect, from the transmitted light, the resonance frequency in the quantum interference state to be the reference and the resonance frequencies in the specific two quantum interference states.

(Supplementary Note 6)

The quantum interference device according to any of Supplementary Notes 2 to 5, wherein the control unit is configured to control a magnetic field applied to the alkali metal atom cell so that the magnetic field strength falls within a preset range as the frequency determination process.

(Supplementary Note 7)

The quantum interference device according to any of Supplementary Notes 2 to 6, wherein the control unit is configured to control a magnetic field applied to the alkali metal atom cell based on a preset variation amount of the resonance frequency in the quantum interference state to be the reference with respect to a magnetic field and the determined magnetic field strength, as the frequency determination process.

(Supplementary Note 8)

The quantum interference device according to any of Supplementary Notes 2 to 7, wherein the control unit is configured to correct the resonance frequency in the quantum interference state to be the reference detected from the transmitted light, based on a preset variation amount of the resonance frequency in the quantum interference state to be the reference with respect to a magnetic field and the determined magnetic field strength, as the frequency determination process.

(Supplementary Note 9)

A control method executed by a control unit in a quantum interference device including a light generating unit configured to generate an excitation light having at least two frequency components, an alkali metal atom cell to which the excitation lights are emitted, a light detecting unit configured to detect a transmitted light from the alkali metal atom cell and the control unit configured to execute a frequency determination process to determine a resonance frequency in a quantum interference state to be a reference based on the transmitted light, the control method comprising by the control unit, detecting resonance frequencies in at least two quantum interference states from the transmitted light, and controlling the frequency determination process based on the detected resonance frequencies in the at least two quantum interference states and magnetic field information representing preset variation amounts of the resonance frequencies in the at least two quantum interference states with respect to a magnetic field.

(Supplementary Note 9.1)

The control method according to Supplementary Note 9, comprising detecting resonance frequencies in specific two quantum interference states, determining a magnetic field strength based on a difference of the resonance frequencies and the magnetic field information of the specific two quantum interference states stored in advance, and controlling the frequency determination process based on the determined magnetic field strength.

(Supplementary Note 9.2)

The control method according to Supplementary Note 9.1, wherein the specific two quantum interference states are quantum interference states in which variation amounts of resonance frequencies with respect to a magnetic field are linear.

(Supplementary Note 9.3)

The control method according to Supplementary Note 9.1 or 9.2, comprising detecting, from the transmitted light, the resonance frequency in the quantum interference state to be the reference and the resonance frequencies in the specific two quantum interference states in which variation amounts of resonance frequencies with respect to a magnetic field are larger than in the quantum interference state to be the reference.

(Supplementary Note 9.4)

The control method according to any of Supplementary Notes 9.1 to 9.3, comprising controlling to generate the excitation lights to be emitted to the alkali metal atom cell so as to be able to detect, from the transmitted light, the resonance frequency in the quantum interference state to be the reference and the resonance frequencies in the specific two quantum interference states.

(Supplementary Note 9.5)

The control method according to any of Supplementary Notes 9.1 to 9.4, comprising controlling a magnetic field applied to the alkali metal atom cell so that the magnetic field strength falls within a preset range.

(Supplementary Note 9.6)

The control method according to any of Supplementary Notes 9.1 to 9.5, comprising controlling a magnetic field applied to the alkali metal atom cell based on a preset variation amount of the resonance frequency in the quantum interference state to be the reference with respect to a magnetic field and the determined magnetic field strength.

(Supplementary Note 9.7)

The control method according to any of Supplementary Notes 9.1 to 9.6, comprising correcting the resonance frequency in the quantum interference state to be the reference detected from the transmitted light, based on a preset variation amount of the resonance frequency in the quantum interference state to be the reference with respect to a magnetic field and the determined magnetic field strength.

(Supplementary Note 10)

A computer program comprising instructions for causing a control unit in a quantum interference device to execute a following process, the quantum interference device including a light generating unit configured to generate an excitation light having at least two frequency components, an alkali metal atom cell to which the excitation lights are emitted, a light detecting unit configured to detect a transmitted light from the alkali metal atom cell and the control unit configured to execute a frequency determination process to determine a resonance frequency in a quantum interference state to be a reference based on the transmitted light, the following process being to detect resonance frequencies in at least two quantum interference states from the transmitted light, and control the frequency determination process based on the detected resonance frequencies in the at least two quantum interference states and magnetic field information representing preset variation amounts of the resonance frequencies in the at least two quantum interference states with respect to a magnetic field.

(Supplementary Note 11)

A control device in a quantum interference device including a light generating unit configured to generate an excitation light having at least two frequency components, an alkali metal atom cell to which the excitation lights are emitted, a light detecting unit configured to detect a transmitted light from the alkali metal atom cell, and the control device configured to execute a frequency determination process to determine a resonance frequency in a quantum interference state to be a reference based on the transmitted light, the control device being configured to detect resonance frequencies in at least two quantum interference states from the transmitted light, and control the frequency determination process based on the detected resonance frequencies in the at least two quantum interference states and magnetic field information representing preset variation amounts of the resonance frequencies in the at least two quantum interference states with respect to a magnetic field.

DESCRIPTION OF NUMERALS 1 light generating unit
2 space
3 alkali metal atom cell
4 light detecting unit
5 control device
51 frequency determining unit
52 magnetic field determining unit
53 magnetic field control unit
54 frequency control unit
55 storing unit
56 reference frequency correcting unit
6 solenoid coil
100 quantum interference device
101 light generating unit
102 alkali metal atom cell
103 light detecting unit
104 control unit

The invention claimed is:

1. A quantum interference device comprising a light generating unit configured to generate an excitation light having at least two frequency components, an alkali metal atom cell to which the excitation lights are emitted, a light detecting unit configured to detect a transmitted light from the alkali metal atom cell, and a control unit configured to execute a frequency determination process to determine a resonance frequency in a quantum interference state to be a reference based on the transmitted light, wherein the control unit is configured to detect resonance frequencies in at least two quantum interference states from the transmitted light, and control the frequency determination process based on the detected resonance frequencies in the at least two quantum interference states and magnetic field information representing preset variation amounts of the resonance frequencies in the at least two quantum interference states with respect to a magnetic field.

2. The quantum interference device according to claim 1, wherein the control unit stores therein the magnetic field information of specific two quantum interference states, and is configured to detect resonance frequencies in the specific two quantum interference states, determine a magnetic field strength based on a difference of the resonance frequencies and the magnetic field information, and control the frequency determination process based on the determined magnetic field strength.

3. The quantum interference device according to claim 2, wherein the specific two quantum interference states are quantum interference states in which variation amounts of resonance frequencies with respect to a magnetic field are linear.

4. The quantum interference device according to claim 2, wherein the control unit is configured to detect, from the transmitted light, the resonance frequency in the quantum interference state to be the reference and the resonance frequencies in the specific two quantum interference states in which variation amounts of resonance frequencies with respect to a magnetic field are larger than in the quantum interference state to be the reference.

5. The quantum interference device according to claim 2, wherein the control unit is configured to control the light generating unit to generate the excitation lights to be emitted to the alkali metal atom cell so as to be able to detect, from the transmitted light, the resonance frequency in the quantum interference state to be the reference and the resonance frequencies in the specific two quantum interference states.

6. The quantum interference device according to claim 2, wherein
the control unit is configured to control a magnetic field applied to the alkali metal atom cell so that the magnetic field strength falls within a preset range as the frequency determination process.

7. The quantum interference device according to claim 2, wherein
the control unit is configured to control a magnetic field applied to the alkali metal atom cell based on a preset variation amount of the resonance frequency in the quantum interference state to be the reference with respect to a magnetic field and the determined magnetic field strength, as the frequency determination process.

8. The quantum interference device according to claim 2, wherein
the control unit is configured to correct the resonance frequency in the quantum interference state to be the reference detected from the transmitted light, based on a preset variation amount of the resonance frequency in the quantum interference state to be the reference with respect to a magnetic field and the determined magnetic field strength, as the frequency determination process.

9. A control method executed by a control unit in a quantum interference device including a light generating unit configured to generate an excitation light having at least two frequency components, an alkali metal atom cell to which the excitation lights are emitted, a light detecting unit configured to detect a transmitted light from the alkali metal atom cell and the control unit configured to execute a frequency determination process to determine a resonance frequency in a quantum interference state to be a reference based on the transmitted light, the control method comprising
by the control unit, detecting resonance frequencies in at least two quantum interference states from the transmitted light, and controlling the frequency determination process based on the detected resonance frequencies in the at least two quantum interference states and magnetic field information representing preset variation amounts of the resonance frequencies in the at least two quantum interference states with respect to a magnetic field.

10. The control method according to claim 9, comprising
detecting resonance frequencies in specific two quantum interference states, determining a magnetic field strength based on a difference of the resonance frequencies and the magnetic field information of the specific two quantum interference states stored in advance, and controlling the frequency determination process based on the determined magnetic field strength.

11. The control method according to claim 10, wherein
the specific two quantum interference states are quantum interference states in which variation amounts of resonance frequencies with respect to a magnetic field are linear.

12. The control method according to claim 10, comprising
detecting, from the transmitted light, the resonance frequency in the quantum interference state to be the reference and the resonance frequencies in the specific two quantum interference states in which variation amounts of resonance frequencies with respect to a magnetic field are larger than in the quantum interference state to be the reference.

13. The control method according to claim 10, comprising
controlling to generate the excitation lights to be emitted to the alkali metal atom cell so as to be able to detect, from the transmitted light, the resonance frequency in the quantum interference state to be the reference and the resonance frequencies in the specific two quantum interference states.

14. The control method according to claim 10, comprising
controlling a magnetic field applied to the alkali metal atom cell so that the magnetic field strength falls within a preset range.

15. The control method according to claim 10, comprising
controlling a magnetic field applied to the alkali metal atom cell based on a preset variation amount of the resonance frequency in the quantum interference state to be the reference with respect to a magnetic field and the determined magnetic field strength.

16. The control method according to claim 10, comprising
correcting the resonance frequency in the quantum interference state to be the reference detected from the transmitted light, based on a preset variation amount of the resonance frequency in the quantum interference state to be the reference with respect to a magnetic field and the determined magnetic field strength.

17. A non-transitory computer-readable medium having a program stored therein, the program comprising instructions for causing a control unit in a quantum interference device to execute a following process, the quantum interference device including a light generating unit configured to generate an excitation light having at least two frequency components, an alkali metal atom cell to which the excitation lights are emitted, a light detecting unit configured to detect a transmitted light from the alkali metal atom cell and the control unit configured to execute a frequency determination process to determine a resonance frequency in a quantum interference state to be a reference based on the transmitted light, the following process being to
detect resonance frequencies in at least two quantum interference states from the transmitted light, and control the frequency determination process based on the detected resonance frequencies in the at least two quantum interference states and magnetic field information representing preset variation amounts of the resonance frequencies in the at least two quantum interference states with respect to a magnetic field.

* * * * *